United States Patent [19]

Bouwknegt

[11] 4,406,367

[45] Sep. 27, 1983

[54] PACKAGE FOR ELECTRICAL AND/OR ELECTRONIC COMPONENTS

[75] Inventor: Jan Bouwknegt, Eindhoven, Netherlands

[73] Assignee: U.S. Philips Corporation, New York, N.Y.

[21] Appl. No.: 293,755

[22] Filed: Aug. 17, 1981

[30] Foreign Application Priority Data

Sep. 8, 1980 [NL] Netherlands ..................... 8005052

[51] Int. Cl.³ ............................................. B65D 73/02
[52] U.S. Cl. ................................. 206/329; 206/332; 206/460
[58] Field of Search ............ 206/329, 330, 332, 389, 206/460, 634, 328, 499

[56] References Cited

U.S. PATENT DOCUMENTS

| | | | |
|---|---|---|---|
| 2,251,609 | 8/1941 | Freeburg | 206/330 |
| 3,608,711 | 9/1971 | Wiesler et al. | 206/330 |
| 3,695,414 | 10/1972 | Wiesler et al. | 206/330 |
| 4,004,688 | 1/1977 | Braden | 206/330 |
| 4,193,287 | 3/1980 | Pfeiffer | 206/329 |
| 4,298,120 | 11/1981 | Kaneko et al. | 206/329 |

*Primary Examiner*—Joseph Man-Fu Moy
*Attorney, Agent, or Firm*—James J. Cannon, Jr.

[57] ABSTRACT

A package for electrical and/or electronic components such as capacitors and resistors comprises a strip-shaped carrier formed with apertures which are uniformly spaced along the carrier for accommodating the components. The carrier is also formed with a row or rows of feed perforations, by means of which the package can be fed along in a feed machine. The components are held in the apertures by two tapes which extend longitudinally of the carrier on one side thereof and which each have an adhesive layer on the side facing the carrier. The tapes are spaced from each other and extend over portions of each aperture so that the aperture is only partially covered by the tapes. This leaves part of the component in the aperture exposed so that an ejector can engage the component to press it out of the aperture.

1 Claim, 4 Drawing Figures

PACKAGE FOR ELECTRICAL AND/OR ELECTRONIC COMPONENTS

BACKGROUND OF THE INVENTION

The invention relates to a package for electrical and/or electronic components, comprising a strip-shaped carrier formed with apertures which are uniformly spaced along the carrier and which serve to accommodate the components, and with at least one row of feed perforations.

DESCRIPTION OF THE PRIOR ART

Such a package is very suitable for the feeding and further processing of plate-shaped and block-shaped components of comparatively small dimensions. For holding the components in the apertures in the carrier it has been proposed in U.S. Pat. No. 3,608,711 to provide on one side of the carrier a tape with an adhesive layer which completely covers each aperture. Due to the adhesive layer, each component remains accurately fixed in the position in which it was arranged in the respective aperture. Because the apertures are open on one side of the strip-shaped carrier, the components are freely accessible from this side. However, the removal of the components from the apertures often causes problems due to the adhesion of the components to the tape on the other side of the carrier. In order to mitigate these problems, it has already been proposed to provide the tape with perforations through which an ejector can pass to press the components out of the apertures. However, this proposed solution has a drawback in that there are problems in correctly positioning the perforated tape on the apertured carrier. The risk of the perforations in the tape not being correctly situated with respect to the apertures in the carrier is very high.

SUMMARY OF THE INVENTION

According to the invention there is provided a package for electrical and/or electronic components, comprising a strip-shaped carrier formed with apertures which are uniformly spaced along the carrier and which serve to accommodate the components, and with at least one row of feed perforations, wherein for holding the components in the apertures the carrier is provided on one side with a tape or tapes which or each of which extends longitudinally of the strip-shaped carrier and has an adhesive layer on its side which faces the carrier, the tape or tapes being arranged to extend over a portion or portions of each aperture so that the aperture is partially covered by the tape or tapes.

This partial covering of the apertures in the carrier by a tape or tapes to retain the components in the apertures eliminates the need for accurate positioning of a tape on the carrier in the longitudinal direction.

Although in given circumstances one tape will suffice, in a preferred embodiment of the invention the carrier is provided with two of said tapes, each of which covers a portion of each aperture adjacent a respective one of two opposite sides of the aperture so that an intermediate portion of the aperture is free of the tapes.

BRIEF DESCRIPTION OF THE DRAWINGS

An embodiment of the invention will be described in detail hereinafter with reference to the accompanying drawings, in which.

DESCRIPTION OF THE PREFERRED EMBODIMENT

Figure 1:
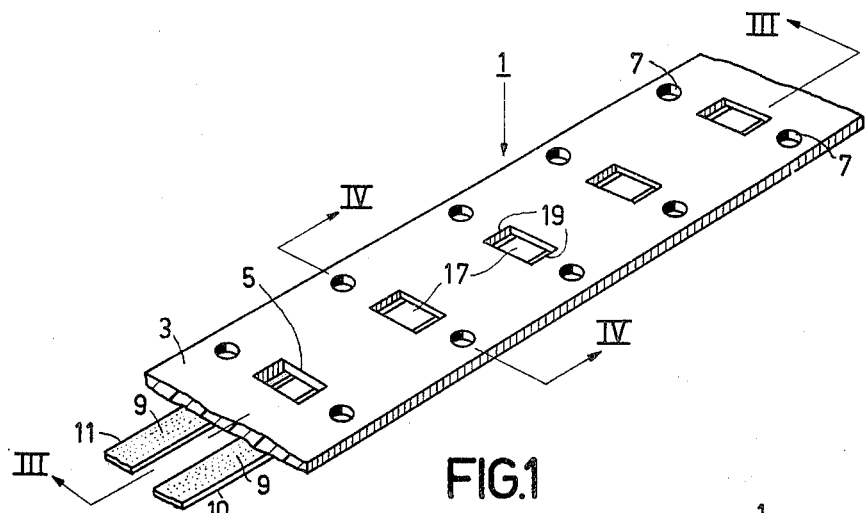
FIG. 1 is a perspective view of part of a package according to an embodiment of the invention.
Figure 2:
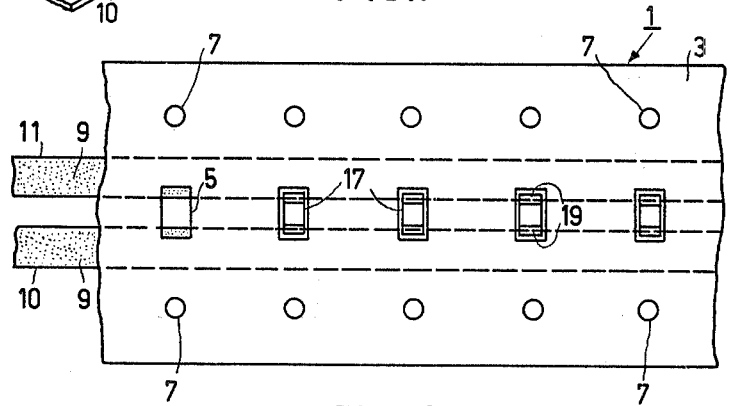
FIG. 2 is a plan view of part of this package.
Figure 3:
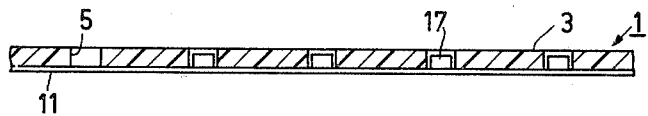
FIG. 3 is a longitudinal sectional view of part of the package, taken along the line III—III in FIG. 1.
Figure 4:
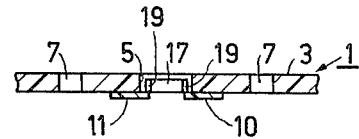
FIG. 4 is a transverse sectional view of part of the package, taken along the line IV—IV of FIG. 1.

The package 1 shown in the drawing comprises a strip-shaped carrier 3 with apertures 5 which are regularly spaced along the carrier and which serve to accommodate electrical and/or electronic components 17. The carrier 3 is also formed with two rows of feed perforations 7 which are arranged on opposite sides of the apertures 5 and by means of which the package can be fed along in a filling or feeding machine. To one side of the carrier 3, the lower side in the drawing, two narrow tapes 10 and 11 are affixed, each tape being provided with an adhesive layer 9 on its upper side. The adhesive layer 9 is preferably formed by a contact adhesive or a pressure-sensitive self-adhesive material. The tapes 10 and 11 extend longitudinally of the carrier and are spaced from each other in positions such that each tape extends over and covers a portion of each aperture adjacent a respective one of two opposite sides thereof. This leaves an intermediate portion of each aperture face of the tapes so that a central portion of the component 17 in the aperture is exposed, while the end faces of the component adhere to the tapes 10 and 11. The components 17 often have a prismatic shape with electrical contact faces 19 at their end. The shape of the apertures 5 is adapted to the shape of the components but their size is such that the components do not touch the edges of the apertures, so there is no risk of jamming or tilting of the components in the apertures. The contact faces 19 bear on the adhesive tapes 10 and 11.

In order to achieve optimum protection of the components the thickness of the strip-shaped carrier 3 at least equals the thickness of the components, so that the components are situated wholly within the apertures. In the case of less vulnerable and larger components, the thickness of the carrier 3 may alternatively be slightly smaller than the thickness of the components, so that the components project slightly from one side of the carrier.

The package in accordance with the invention does not involve any alignment problems when the tapes 10 and 11 are being affixed to the carrier 3, because a continuous gap remains between the tapes. Therefore, no synchronization problems occur between the tapes and the carrier during the attachment of the tapes.

Although the drawing shows the use of two tapes with adhesive layers, in given circumstances it may alternatively be possible to use one tape with an adhesive layer, the tape being arranged to extend over a central position of each aperture. The central portion of each component then adheres to the tape while its end faces remain free. This offers the additional advantage that the electrical contact faces remain free of adhesive, so that any subsequent soldering process is not affected by residual adhesive on the contact faces.

The package in accordance with the invention is very suitable for plate-shaped and block-shaped components which do not have the conventional connection wires and which have very small dimensions of the order of a few millimeters, such as resistors, capacitors, transistors etc. The package can also be used for components having short connection studs.

The strip-shaped carrier 3 may be made of any suitable material, such as paper, cardboard or a synthetic resin material. If the carrier is made of a rigid material having a comparatively large thickness, the package will be shaped like an elongate cassette. If the carrier is made of a flexible material having a small thickness, the package will be shaped like a flexible ribbon which can be wound to form a coil.

The adhesive tapes 10 and 11 are made of a material which is much thinner than that of the carrier 3 and which may be, for example, paper or a synthetic resin material.

What I claim is:
1. A package for electrical and/or electronic components, comprising a strip-shaped carrier formed with apertures which are uniformly spaced along the carrier and which serve to accommodate the components, and with at least one row of feed perforations, wherein for holding the components in the apertures, said carrier is provided on one side with two tapes, each of which extends longitudinally of the strip-shaped carrier and has an adhesive layer on the side which faces the carrier, each of which covers a portion of each aperture adjacent a respective one of two opposite sides of the aperture so that an intermediate portion of the aperture is free of the tape.

* * * * *